(12) United States Patent
Choi et al.

(10) Patent No.: US 10,269,677 B2
(45) Date of Patent: Apr. 23, 2019

(54) SEMICONDUCTOR PACKAGE AND A METHOD OF MANUFACTURING THE SAME

(71) Applicant: MagnaChip Semiconductor, Ltd., Cheongju-si (KR)

(72) Inventors: Jae Sik Choi, Cheongju-si (KR); Dong Seong Oh, Incheon-si (KR); Si Hyeon Go, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 11 days.

(21) Appl. No.: 15/491,025

(22) Filed: Apr. 19, 2017

(65) Prior Publication Data
US 2018/0151465 A1    May 31, 2018

(30) Foreign Application Priority Data
Nov. 30, 2016   (KR) .......................... 10-2016-0161106

(51) Int. Cl.
| | |
|---|---|
| H01L 21/48 | (2006.01) |
| H01L 21/56 | (2006.01) |
| H01L 23/367 | (2006.01) |
| H01L 23/485 | (2006.01) |
| H01L 23/544 | (2006.01) |

(52) U.S. Cl.
CPC ........ H01L 23/367 (2013.01); H01L 21/4853 (2013.01); H01L 21/561 (2013.01); H01L 23/485 (2013.01); H01L 23/544 (2013.01); H01L 2223/5448 (2013.01)

(58) Field of Classification Search
CPC ................. H01L 25/072; H01L 25/115; H01L 2224/023; H01L 2224/03002; H01L 2224/03005; H01L 2224/03009; H01L 25/105; H01L 25/16–25/167; H01L 25/18; H01L 25/07–25/074; H01L 25/11–25/117; H01L 25/042; H01L 25/0655; H01L 25/0753; H01L 21/78; H01L 21/782; H01L 21/784; H01L 21/786; H05K 1/021
See application file for complete search history.

(56) References Cited

U.S. PATENT DOCUMENTS

| | | | |
|---|---|---|---|
| 8,124,471 B2 | 2/2012 | Kiong et al. | |
| 2002/0041012 A1* | 4/2002 | Sakamoto | ........... H01L 21/4832 257/678 |
| 2014/0252593 A1* | 9/2014 | Chen | ................. H01L 23/49811 257/737 |

\* cited by examiner

*Primary Examiner* — Moazzam Hossain
*Assistant Examiner* — Stanetta D Isaac
(74) *Attorney, Agent, or Firm* — NSIP Law

(57) ABSTRACT

A method to manufacture a semiconductor package includes: preparing a metal substrate; attaching semiconductor dies to the metal substrate at an interval; attaching a bonding film to the semiconductor dies; applying a mold material on the semiconductor dies and the metal substrate, and curing the mold material to form a mold member; grinding the mold member and the metal substrate to a thickness; removing the bonding film; attaching a redistribution layer to the semiconductor dies; and cutting between the semiconductor dies.

15 Claims, 11 Drawing Sheets

SEMICONDUCTOR PACKAGE AND A METHOD OF MANUFACTURING THE SAME

CROSS-REFERENCE TO RELATED APPLICATIONS

This application claims the benefit under 35 USC 119(a) of Korean Patent Application No. 10-2016-0161106 filed on Nov. 30, 2016 in the Korean Intellectual Property Office, the entire disclosure of which is incorporated herein by reference for all purposes.

BACKGROUND

1. Field

The following description relates to a semiconductor package and a method of manufacturing a semiconductor package. More particularly, the following description relates to a semiconductor package with improved heat dissipation in a semiconductor die.

2. Description of Related Art

Semiconductor packaging is a process of packaging a semiconductor chip or die in order to electrically connect the semiconductor chip or die to a device. A fan-out wafer level package (FOWLP) has been proposed in which input/output terminals of a semiconductor package are disposed outside a semiconductor die of reduced size using a redistribution layer. The FOWLP has the advantage of being able to provide a simple packaging process, a reduced size and a thin thickness. Furthermore, the FOWLP has excellent thermal characteristics and electrical characteristics.

Generally, a process of molding a semiconductor die with an epoxy molding compound (EMC) is adopted for the purpose of heat dissipation and protection of the semiconductor die. However, in a case of a semiconductor die packaged by applying the FOWLP method, it is difficult to effectively solve the heat dissipation problem of the semiconductor package by the molding process alone. In order to solve this problem, a printed circuit board (PCB) substrate of a set product, on which the semiconductor package is mounted, is utilized, or a method of mounting a heat sink on an outside of the semiconductor package is adopted. In this case, there is a problem that a size of a mounted set product becomes too large.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method to manufacture a semiconductor package includes: preparing a metal substrate; attaching semiconductor dies to the metal substrate at an interval; attaching a bonding film to the semiconductor dies; applying a mold material on the semiconductor dies and the metal substrate, and curing the mold material to form a mold member; grinding the mold member and the metal substrate to a thickness; removing the bonding film; attaching a redistribution layer to the semiconductor dies; and cutting between the semiconductor dies.

The attaching of the semiconductor dies may include applying an adhesive conductive material on the metal substrate at the interval, and attaching the semiconductor dies to the metal substrate with the adhesive conductive material.

The preparing of the metal substrate may include etching portions of the metal substrate on a side of the metal substrate to a depth to define an array of rectangular-shaped portions on the side of the metal substrate.

The attaching of the semiconductor dies may include attaching the semiconductor dies to the rectangular-shaped portions of the metal substrate on the side of the metal substrate.

The attaching of the semiconductor dies may include attaching the semiconductor dies to portions of the metal substrate corresponding to the rectangular-shaped portions on another side of the metal substrate.

The method may further include: plating an intermediate product formed by the attaching of the redistribution layer.

The method may further include: marking product information on the metal substrate after the plating of the intermediate product.

In another general aspect, a semiconductor package includes: a semiconductor die including a first surface and a second surface; a redistribution layer attached to the first surface and extending outside of an outer periphery of the semiconductor die; a metal substrate attached to the second surface; and a mold member surrounding sides of the semiconductor die, and disposed on the metal substrate.

The semiconductor die may include a gate electrode and a source electrode. The redistribution layer may include a gate metal pattern, a source metal pattern, and an insulating layer. The gate metal pattern and the source metal pattern may be electrically connected to the gate electrode and the source electrode, respectively.

The semiconductor package may further include plating layers disposed on the metal substrate, the gate metal pattern, and the source metal pattern.

The metal substrate may include a copper substrate configured as a drain electrode of the semiconductor die.

The semiconductor package may further include: a PCB substrate attached to a lower side of the semiconductor package; and a drain pattern including an end attached to the PCB substrate and another end attached to the metal substrate.

The semiconductor die may include two semiconductor dies, and the drain pattern is electrically connected to the two semiconductor dies.

In another general aspect, a method to manufacture a semiconductor package includes: attaching semiconductor dies to a first side of a metal substrate so that the semiconductor dies are spaced apart on the first side; forming a mold member in areas between the semiconductor dies and on the metal substrate; grinding the mold member and the metal substrate to reduce a thickness of the mold member and the metal substrate; attaching a redistribution layer to the semiconductor dies; and cutting in an area between adjacent semiconductor dies among the semiconductor dies to separate the adjacent semiconductor dies.

The method may further include: etching the first side of the metal substrate to form recessed areas in the first side of the metal substrate prior to the forming of the mold member, wherein the forming of the mold member in the areas between the semiconductor dies and on the metal substrate includes forming the mold member in the recessed areas.

The grinding of the mold member and the metal substrate may include grinding the mold member and the metal substrate so that the semiconductor dies are electrically separated from each other.

The method may further include: etching a second side of the metal substrate, which is disposed opposite to the first side, to form recessed areas in the second side prior to the forming of the mold member, wherein the forming of the mold member in the areas between the semiconductor dies and on the metal substrate includes forming the mold member in the recessed areas.

The grinding of the mold member and the metal substrate may include grinding the mold member and the metal substrate so that the semiconductor dies are electrically connected to each other by the metal substrate.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
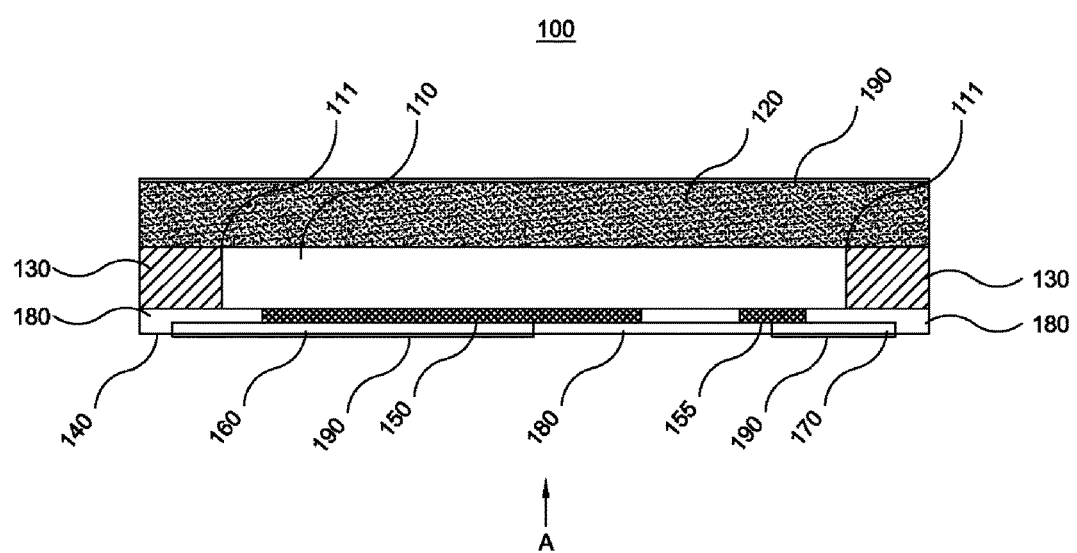
FIG. 1 is a view illustrating a semiconductor package, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Embodiments will be described in more detail below with reference to the appended drawings.

FIG. 1 is a view illustrating a semiconductor package 100, according to an embodiment.

Figure 14:
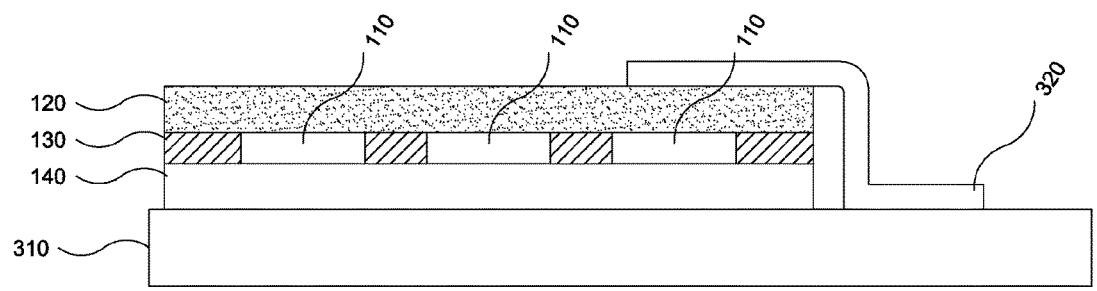
FIG. 14 is a view illustrates a semiconductor package attached to a substrate, according to an embodiment.
Figure 15:
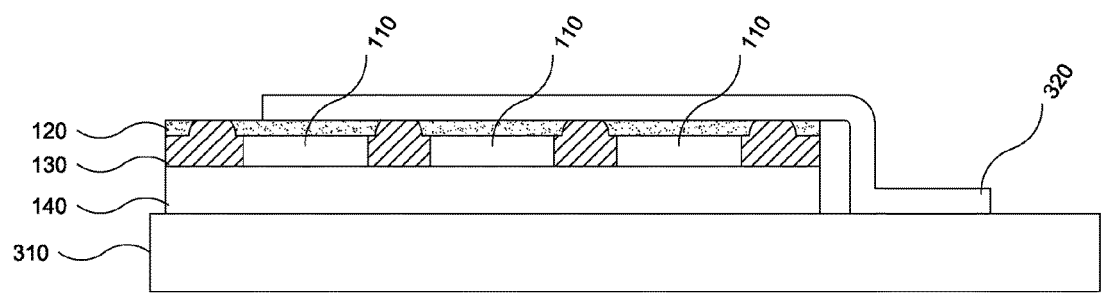
FIG. 15 is a view illustrating a semiconductor package attached to a substrate, according to another embodiment.
Figure 16:
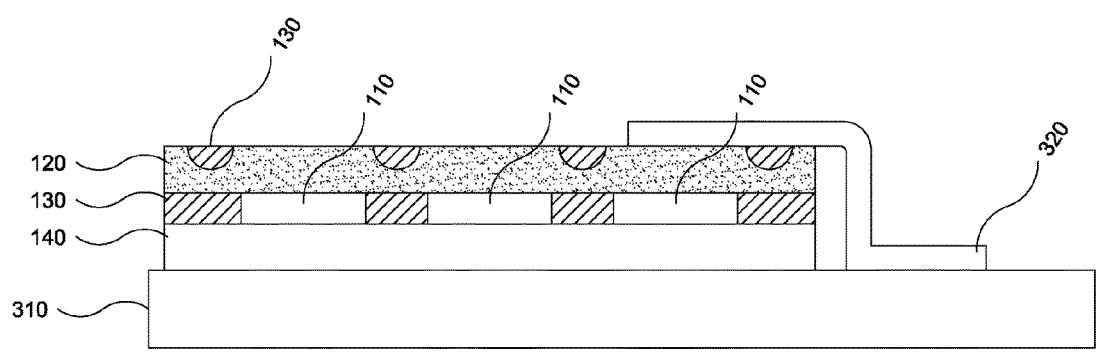
FIG. 16 is a view illustrating a semiconductor package attached to a substrate, according to another embodiment.

As illustrated in FIG. 1, the semiconductor package 100 includes a semiconductor die 110 and a metal substrate 120 attached to the semiconductor die 110. The metal substrate 120 may be formed of various metals, such as a copper substrate. The metal substrate 120 formed of the copper substrate may be a lead frame. The metal substrate 120 may be a heat sink to facilitate heat dissipation of the semiconductor die 110 and may be used as a drain electrode of the semiconductor die 110. The thicker the metal substrate 120, the greater an effect of heat dissipation and lower its resistance. In an embodiment, sides 111 of the semiconductor die 110 are surrounded by a mold member 130, as shown in FIG. 1. In another embodiment, the semiconductor die 110 and sides of the metal substrate 120 are surrounded by the mold member 130. In another embodiment, the semiconductor die 110 and a part of thickness of the metal substrate 120 are surrounded by the mold member 130. The mold member 130 may be formed of an epoxy resin compound. It should be noted that the mold member 130 is not disposed on an outer surface of the metal substrate 120. This is because the metal substrate 120 needs to be exposed to air to effectively work as the heat sink. That is, if the mold member 130 surrounds the metal substrate 120, heat generated by the semiconductor die 110 may not be easily emitted outside. Further, the mold member 130 is not disposed on the outer surface of the metal substrate 120 because, as shown in FIGS. 14 to 16, a drain pattern 320 is formed on the exposed metal substrate 120 in a form of a bus bar or a Cu clip, which is connected to a drain terminal (not shown) of a PCB substrate 310.

Referring to FIG. 1, a redistribution layer 140, which is configured to fan-out a source electrode (or emitter electrode) 150 or a gate electrode (or gate pad) 155, is attached to a bottom of the semiconductor die 110. In other words, the redistribution layer 140 is attached to a first side (e.g., a bottom) of the semiconductor die 110 and extends outwardly from edges of the semiconductor die 110, beyond an outer periphery of the semiconductor die 110. In this way, it becomes possible to enlarge distances between a gate metal pattern 170 and a source metal pattern 160. Balls made of metal (not shown), which are configured to electrically connect to the semiconductor die 110, are disposed on the PCB substrate 310 (FIG. 14 to FIG. 16). It is necessary to have some distances between the gate metal pattern 170 and the source metal pattern 160 due to sizes of the balls. As such, by using the redistribution layer 140, the balls that correspond to the gate metal pattern 170 and the source metal pattern 160 are not stuck together. With this fan-out structure, it is possible to align balls of the PCB substrate 310 and the semiconductor package 100 when attaching the semiconductor package 100 to the PCB substrate 310. That is, the redistribution layer 140 is configured according to distances between balls formed on the PCB substrate 310.

Since a size of the semiconductor die 110 becomes smaller, this fan-out structure is necessary when disposing the semiconductor die 110 on the PCB substrate 310. The redistribution layer 140 is not formed in the manufacturing process of the semiconductor chip. Instead, the redistribution layer 140 is separately fabricated and used to fan-out the semiconductor chip, which is separately fabricated. The redistribution layer 140 directly contacts the source electrode 150 and the gate electrode 155 of the semiconductor die 110. Alternatively, it is also possible to form bumps (not shown) on the source electrode 150 and the gate electrode 155 of the semiconductor die 110 and utilize the redistribution layer 140 to connect to the bumps.

The gate electrode 155 and the source electrode 150 may be formed of metal, such as Al or Cu. The gate electrode 155 may be referred as a gate pad, and the source electrode 150 may be referred as an emitter electrode of a power semiconductor element. The redistribution layer 140 includes the source metal pattern 160, the gate metal pattern 170, and an insulating layer 180. The source metal pattern 160 and the gate metal pattern 170 may be formed of Cu, which has a low resistance. The insulating layer 180 may be formed of an epoxy resin. In an embodiment, the mold member 130 and the insulating layer 180 contact each other; and it is possible to form the mold member 130 and the insulating layer 180 of the epoxy resin compound and adhere them together.

The semiconductor die 110 includes, for example, a power semiconductor element. The power semiconductor element may be a power metal-oxide-semiconductor field-effect transistor (MOSFET) or a super-junction insulated-gate bipolar transistor (IGBT) element, in a form of discrete component or a module. A plating layer 190 is disposed on the metal substrate 120, and on the gate metal pattern 170 and the source metal pattern 160 of the redistribution layer 140. The gate metal pattern 170 is connected to the gate electrode 155. The source metal pattern 160 is electrically connected to the source electrode 150. The redistribution layer 140 may be separately fabricated by a well-known method and attached to the semiconductor die 110 coupled to the metal substrate 120, which is fabricated according to an embodiment disclosed herein. A manufacturing method of the semiconductor die 110 coupled to the metal substrate 120 will be explained later.

Figure 2A:
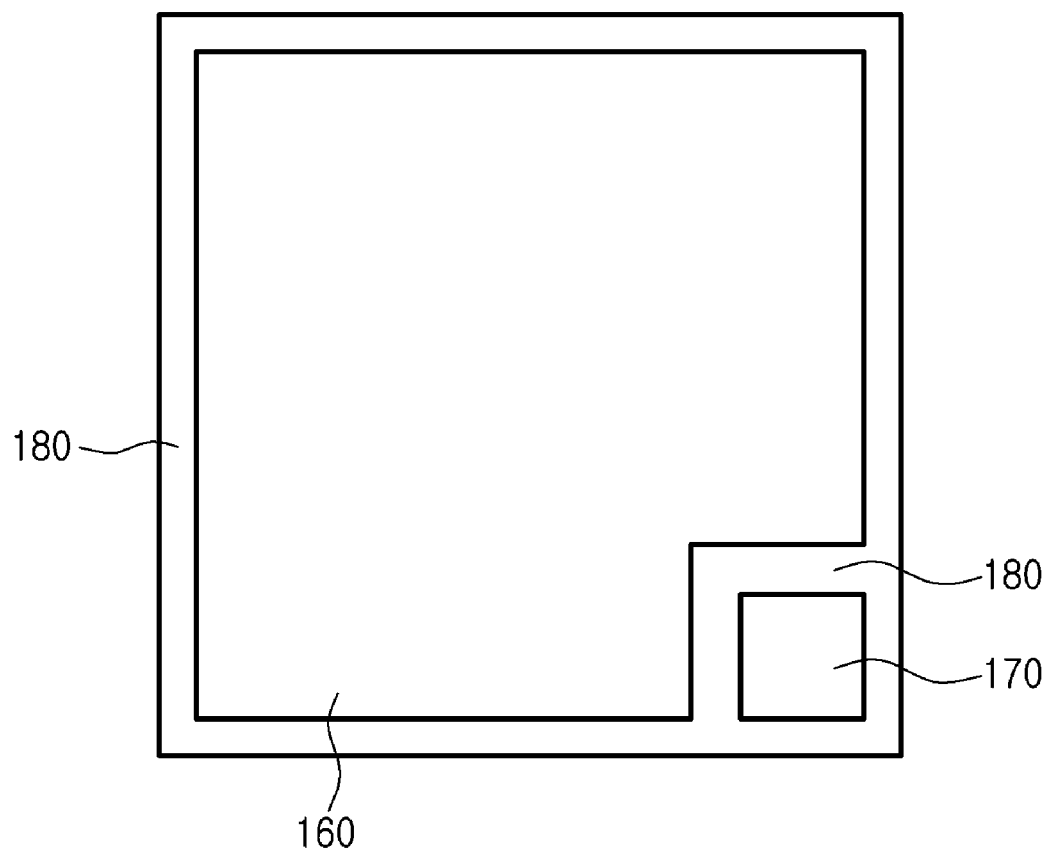
FIG. 2A is a view of the semiconductor package of FIG. 1 viewed in a direction indicated by the arrow A in FIG. 1.

FIG. 2A is a view of the semiconductor package 100 viewed in a direction indicated by the arrow A in FIG. 1. Referring to FIG. 2A, the source metal pattern 160 is larger than the gate metal pattern 170, and the source metal pattern 160 and the gate metal pattern 170 are separated from each other by the insulating layer 180.

Figure 2B:
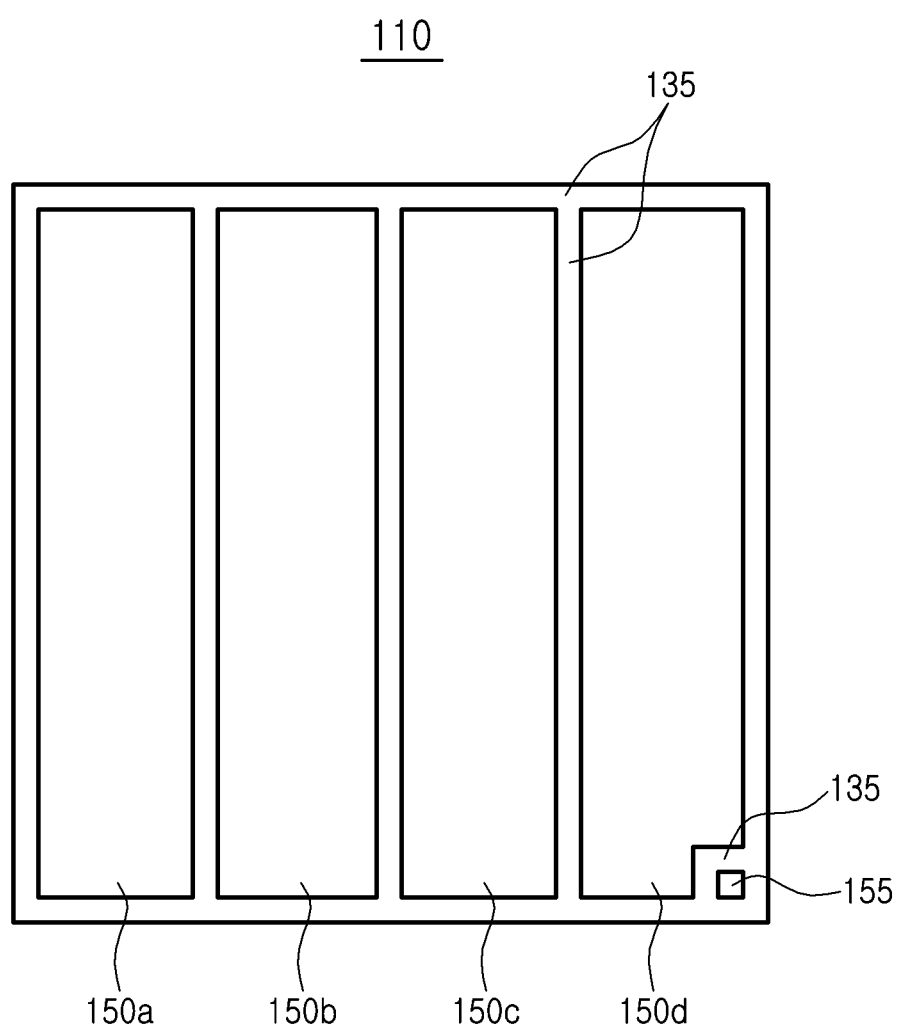
FIG. 2B is a view of a semiconductor die of the semiconductor package viewed in a direction indicated by the arrow A in FIG. 1.

FIG. 2B is a view of the semiconductor die 110 viewed in a direction indicated by the arrow A in FIG. 1. Referring to FIG. 2B, source electrodes 150a-150d are disposed on the semiconductor die 110. The gate electrode 155 is disposed on one corner of the semiconductor die 110. All of the source electrodes 150a-150d are electrically connected to the source metal pattern 160. A passivation layer 135, which is configured to protect a semiconductor element, is formed between the source electrodes 150a-150d. Gate bus lines (not shown) may pass below the passivation layer 135. That is, gate bus lines are disposed between the source electrodes 150a-150d.

Figure 3:
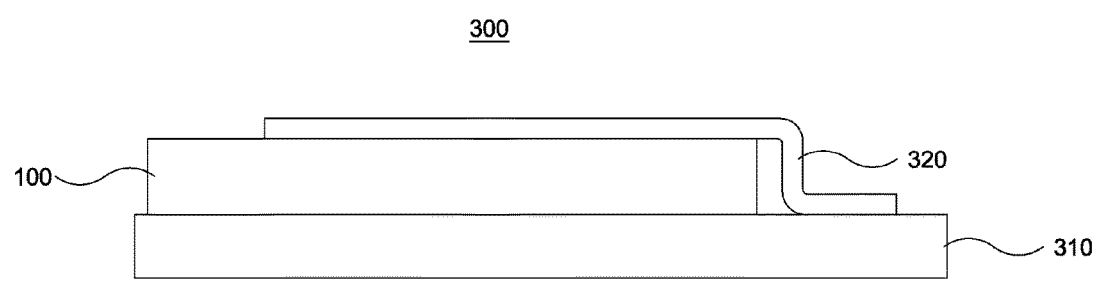
FIG. 3 is a view illustrating a semiconductor package attached to a substrate, according to an embodiment.

FIG. 3 is a view illustrating a semiconductor device 300 including the semiconductor package 100 attached to a substrate 310, such as a printed circuit board (PCB) substrate, according to an embodiment. A manufacturer of the semiconductor device 300 may attach one end of the drain pattern 320 to the substrate 310 and other end of the drain pattern 320 to a desired position of the semiconductor package 100, thereby easily fabricating the semiconductor device 300. If necessary, a plurality of semiconductor packages 100 may be attached to the substrate 310 and the drain pattern 320 may be added to be commonly used by the plurality of semiconductor packages 100 (see FIGS. 14 to 16). The drain pattern 320 may be fabricated in a form of a Cu clip or a bus-bar. In this case, the drain pattern 320 is electrically connected to each drain electrode of the semiconductor dies 100 and a drain terminal (not shown) of the substrate 310.

Hereinafter, a method for fabricating the semiconductor package 100, according to an embodiment, will be explained with reference to FIG. 4 and FIG. 16.

Figure 4:
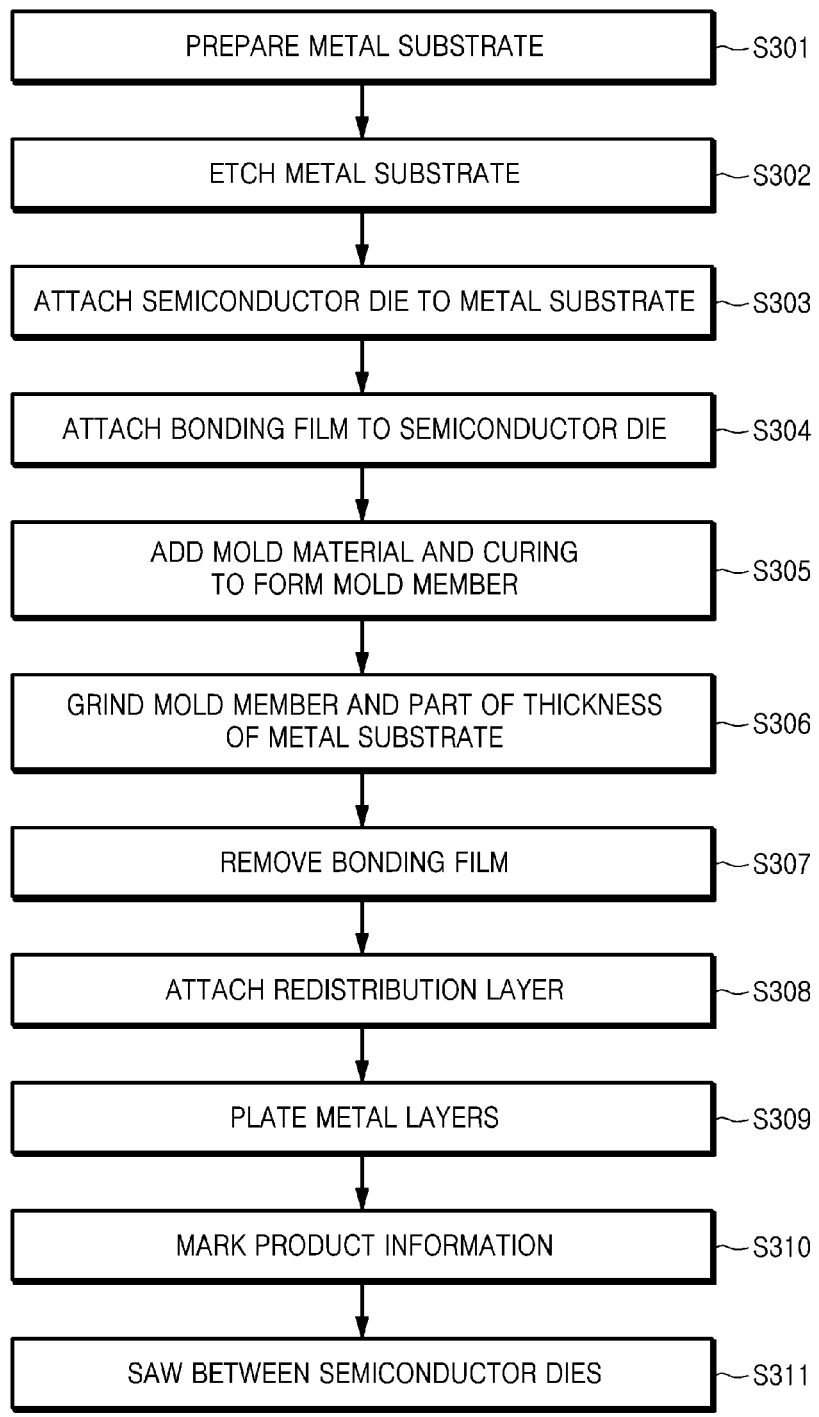
FIG. 4 is a flowchart of a method for manufacturing a semiconductor package, according to an embodiment.

FIG. 4 is a flowchart of a method for manufacturing the semiconductor package 100, according to an embodiment.

Figure 5:
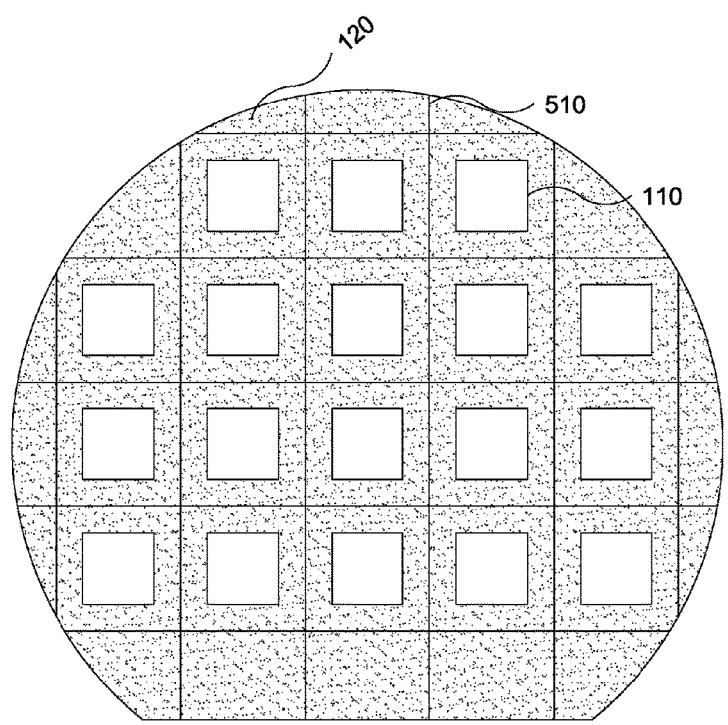
FIG. 5 is a view illustrating semiconductor dies attached to a metal substrate, according to an embodiment.

Referring to FIG. 4, in an initial operation S301 of the method for manufacturing the semiconductor package 100, a metal substrate 120 is prepared. The metal substrate 120 may include a copper substrate. The metal substrate 120 may be prepared by preparing a flat metal plate having a predetermined thickness, for example, 150 to 250 μm, and cutting it into the metal substrate 120 in the form of a wafer, as shown in FIG. 5. Still referring to FIG. 5, in embodiments, a part of a thickness, for example, a half of a thickness, of the metal substrate 120 is etched to form a rectangular cell array 510 in operation S302.

Figure 6:
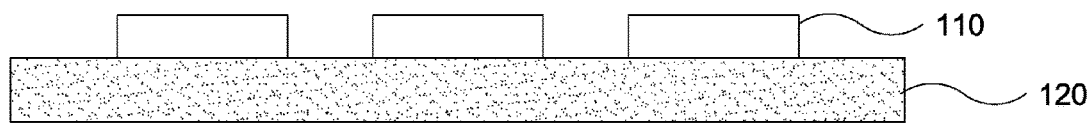
FIG. 6 is a view illustrating semiconductor dies attached to a metal substrate, according to another embodiment.
Figure 7:
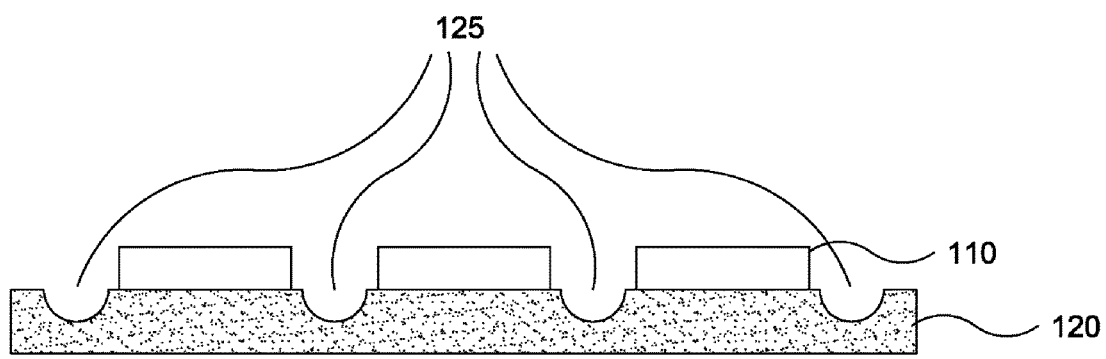
FIG. 7 is a view illustrating semiconductor dies attached to a metal substrate, according to another embodiment.
Figure 8:
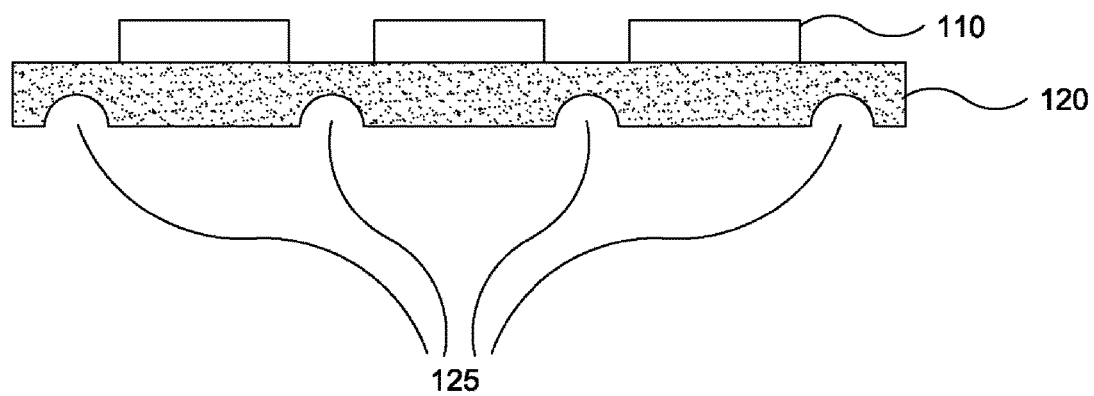
FIG. 8 is a view illustrating semiconductor dies attached to a metal substrate, according to another embodiment.

In operation S303, according to an embodiment, an adhesive conductive material, such as solder paste, is applied to the metal substrate 120 and the semiconductor dies 110 are attached to the metal substrate 120 at a predetermined interval, as illustrated in FIG. 6. In another embodiment, a first side of a metal substrate 120 is etched to form recessed or thin areas 125 of reduced thickness and thereby form an array of rectangular cells, as shown in FIG. 5, and then the semiconductor dies 110 are attached to each rectangular cell on the first, etched, side of the metal substrate 120, as illustrated in FIG. 7. In another embodiment, illustrated in FIG. 8, a second side of a metal substrate 120, opposite to the first side, is etched to form recessed or thin areas 125 of reduced thickness and thereby form the array of rectangular cells, and then the semiconductor dies 110 are attached to each rectangular cell on the first, unetched, side of the metal substrate 120. A thickness of the semiconductor die 110 may be in a range of 100 to 200 μm. As shown in FIG. 7 and FIG. 8, the thin areas 125 have a semi-circular or concave cross-sectional shape and are disposed between the semiconductor dies 110. The metal substrate 120 may be etched by using appropriate chemical solutions in order to form the thin areas 125, which are cutting areas at which the wafer may be cut or sawn in a subsequent process. A thickness of the etched areas is less than that of the unetched areas, so that the etched areas may be easily sawn. Further, the semiconductor dies 110 may be electrically connected or disconnected each other depending on a depth of the thin areas 125. In a subsequent process, the thin areas 125 are filled with the molding member 130, as will be explained later.

Figure 9:
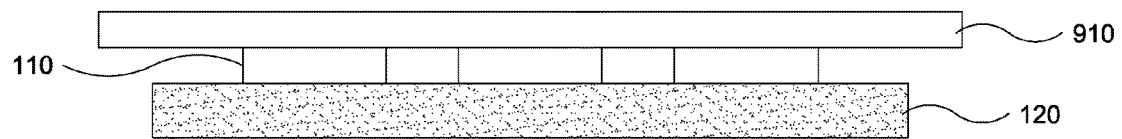
FIG. 9 is a view illustrating a bonding film attached to semiconductor dies, according to an embodiment.

In operation S304, a bonding film 910 is attached to the semiconductor dies 110, as shown in FIG. 9. In an embodiment, the bonding film 910 includes two layers: an adhesive layer; and a carrier layer. In such an embodiment, after subsequent processes are performed, only the carrier layer is removed when the bonding film 910 is removed.

Figure 10:
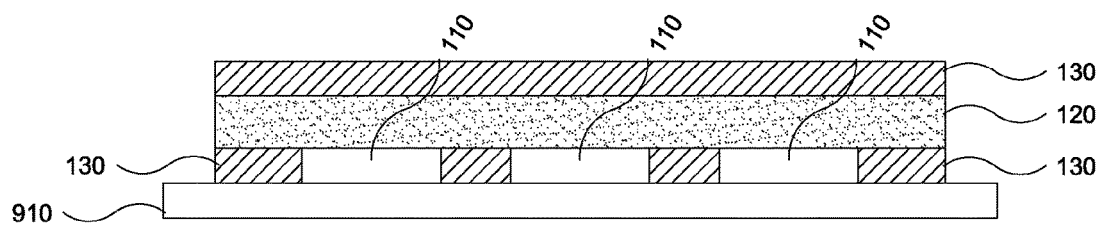
FIG. 10 is a view illustrating mold material added to the structure formed in FIG. 9, according to an embodiment.

In operation S305, an intermediate product is turned over, and then mold material is added on the metal substrate 120 and cured, thereby forming the mold member 130. Therefore, the mold member 130 is filled on the metal substrate 120 and between the semiconductor dies 110, as shown in FIG. 10. When the metal substrate 120 is prepared as shown in FIG. 5, a plurality of openings (not shown) are formed in the metal substrate 120, thereby filling the mold material between the semiconductor dies 110 through the openings. In operation S306, the mold member 130 and a part of thickness of the metal substrate 120 are ground.

Figure 11:
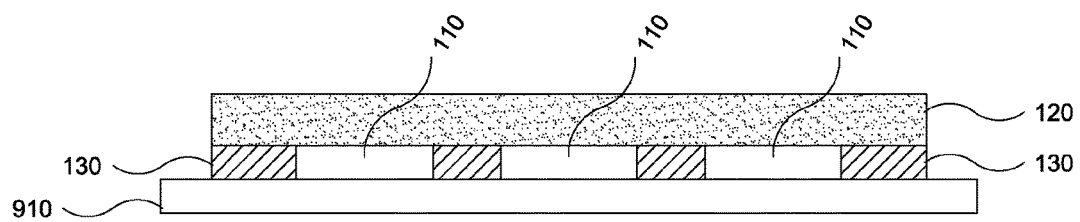
FIG. 11 is a view illustrating the mold material and a metal substrate of FIG. 10, which have been ground, according to another embodiment.

In the embodiment in which the metal substrate 120 is configured as shown in FIG. 6, all of the semiconductor dies 110 are electrically connected by the metal substrate 120 after the grinding, as illustrated in FIG. 11.

Figure 12:
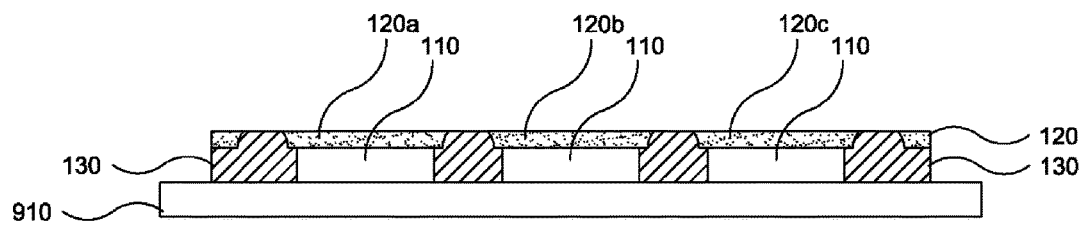
FIG. 12 is a view illustrating the mold material and the metal substrate of FIG. 10, which have been ground, according to another embodiment.

Alternatively, in the embodiment in which the metal substrate 120 is configured as shown in FIG. 7, the semiconductor dies 110 are electrically separated from each other by the mold member 130 after the grinding, as illustrated in FIG. 12. That is, in the embodiment illustrated in FIGS. 7 and 12, the mold member 130 and a part of thickness of the metal substrate 120 are ground until the semiconductor dies 110 are electrically separated from each other. In this way, spaced apart metal substrate portions 120a, 120b, 120c are formed such that each of the metal substrate portions 120a, 120b, 120c corresponds to a respective one of the semiconductor dies 110. Areas, including the thin areas 125, that are filled with the mold member 130 may be sawing or cutting areas. That is, a desired number (e.g., one, two, or more) of semiconductor dies 110 is determined, and an appropriate number of areas filled with the mold member 130 are sawn or cut to separate the desired number of semiconductor dies.

Figure 13:
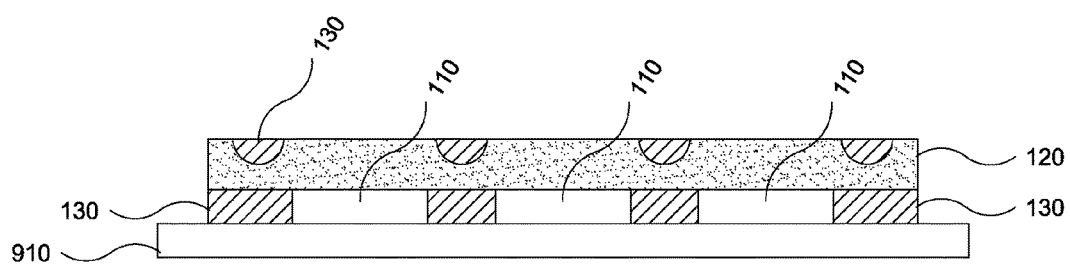
FIG. 13 is a view illustrating the mold material and the metal substrate of FIG. 10, which have been ground, according to another embodiment.

Alternatively, in the embodiment in which the metal substrate 120 is configured as shown in FIG. 8, as is the case in the embodiment shown in FIG. 6, all of the semiconductor dies 110 are electrically connected by the metal substrate 120 after the grinding, as illustrated in FIG. 13. However, the semiconductor package in the embodiment of FIG. 13 is different from the semiconductor package in the embodiment of FIG. 11 in that the mold member 130 in the embodiment of FIG. 13 is also formed in the thin areas 125 in positions vertically aligned with positions of the mold member 130 between the semiconductor dies 110. Mold member portions 130 formed on an upper portion of the metal substrate 120 are spaced apart from each other. In the embodiment of FIG. 13, a thickness of areas of the metal substrate 120 that are to be sawn is smaller than that of the embodiment of FIG. 11. This is because the mold member 130 is filled in the upper portion of the metal substrate 120 in a semicircular cross-sectional shape. The sawing process will be explained below.

Thereafter, in operation S307, the intermediate product is turned over and the bonding film 910 is removed. In operation S308, the redistribution layer 140 for fan-out is attached to the surface from which the bonding film 910 has been removed. Then, in operation S309, metal layers exposed to outside of the metal substrate 120, the semiconductor dies 110, and the redistribution layer 140 are plated by plating the intermediate product with gold or tin, for example. The purpose of the plating is to prevent oxidation and corrosion of the metal substrate 120 and copper metal used as a metal pattern. Source and gate metal patterns of the redistribution layer 140 can be formed of copper metal, and can be manufactured by an electroplating method. The gate metal pattern and the source metal pattern are directly connected to the gate electrode and the source electrode of the semiconductor die 110, respectively. The gate metal pattern and the source metal pattern may be formed of copper metal or aluminum (Al) metal.

In operation S310, the intermediate product is turned over and product information is marked on the metal substrate 120 by, for example, a laser beam.

In operation S311, sawing or cutting is performed between the semiconductor dies 110. Although the sawing or cutting may be performed to separate each semiconductor die 110, it is possible to perform sawing or cutting to separate any number of the semiconductor dies 110, such as two, three, or more, as needed.

As described above, a manufacturer of the semiconductor device 300 may manufacture the semiconductor device 300 by attaching the semiconductor package 100 to the substrate 310, which may be a PCB substrate, and attaching the drain pattern 320 to the substrate 310 (see FIG. 3). For example, when the semiconductor package 100 is fabricated according to the embodiment of FIGS. 6 and 11, and the semiconductor device 300 is manufactured to include three semiconductor dies 110, the semiconductor dies 110 can all be electrically connected by the metal substrate 120. One end of the drain pattern 320 is attached to the substrate 310 and the other end of the drain pattern 320 is attached only to a portion of the metal substrate 120 corresponding to one semiconductor die 110, as shown in FIG. 14.

For example, when the semiconductor package 100 is fabricated according to the embodiment of FIGS. 7 and 12, and the semiconductor device 300 is manufactured to include three semiconductor dies 110, the semiconductor dies 110 are electrically separated by the mold member 130. As illustrated in FIG. 15, unlike the embodiment of FIGS. 6 and 11, one end of the drain pattern 320 is attached to the substrate 310, and the other end of the drain pattern 320 is attached to each of the metal substrate portions 120, and thus the drain pattern 320 is electrically connected to each of the metal substrates 120 on the three semiconductor dies 110.

For example, when the semiconductor package 100 is fabricated according to the embodiment illustrated in FIGS. 8 and 13, and the semiconductor device 300 is manufactured to include three semiconductor dies 110, the semiconductor dies 110 are all electrically connected by the metal substrate 120, as in the embodiment of FIGS. 6 and 11. Therefore, as is the case in the embodiment of FIGS. 6 and 11, one end of the drain pattern 320 may be attached to a substrate 310 and the other end of the drain pattern 320 is attached only to a portion of the metal substrate 120 corresponding to one semiconductor die 110, as shown in FIG. 16. In the semiconductor package 100 according to the embodiment of FIGS. 8 and 13, the mold member 130 is formed on the upper portion of the metal substrate 120 at positions vertically corresponding to positions of the mold member 130 between the semiconductor dies 110. Since a thickness of the metal substrate 120 that is to be sawn or cut in this embodiment is less than that of the embodiment of FIGS. 6 and 11, it is easier to saw between the semiconductor dies 110 than it is in the embodiment of FIGS. 6 and 11.

In the embodiment of FIGS. 7 and 12, since there is only the mold member 130, which has a lower hardness than the metal substrate 120, between the semiconductor dies 110, and the metal substrate 120 is not disposed between the semiconductor dies 110 at portions to be sawn or cut, it is very easy to saw or cut between the semiconductor dies 110, in comparison to the embodiments of FIGS. 6 and 11, and FIGS. 8 and 13.

According to the embodiments disclosed herein, it is possible to effectively solve a problem of heat dissipation of a semiconductor package while maintaining a size of the semiconductor package substantially equal to that of a chip scale package (CSP). That is, according to the disclosed embodiments, heat generated in the upper and lower portions of the semiconductor die can be transferred to the upper and lower portions of the semiconductor die by attaching a metal substrate serving as a heat sink to one side of the semiconductor die and attaching a redistribution layer to other side of the semiconductor die, and thus it becomes possible to realize a dual cooled package that enables heat dissipation through upper and lower parts of the semiconductor die.

In the embodiments disclosed herein, the arrangement of the illustrated components may vary depending on an environment or requirements to be implemented. For example, some of the components may be omitted or several components may be integrated and implemented together. In addition, the arrangement order of some of the components can be changed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method to manufacture a semiconductor package, the method comprising:
   preparing a metal substrate;
   attaching semiconductor dies to a first side of the metal substrate, the attached semiconductor dies being spaced apart from each other;
   attaching a bonding film to the semiconductor dies;
   applying a mold material in areas between the attached semiconductor dies and on a second side of the metal substrate, and curing the mold material to form a mold member;
   grinding the mold member formed on the second side of the metal substrate and a part of the metal substrate;
   removing the bonding film;
   attaching a redistribution layer to the semiconductor dies; and
   cutting between the semiconductor dies.

2. The method of claim 1, wherein the attaching of the semiconductor dies comprises:
   applying an adhesive conductive material on the first side of the metal substrate, and
   attaching the semiconductor dies to the first side of the metal substrate with the adhesive conductive material.

3. The method of claim 1, wherein the preparing of the metal substrate comprises etching portions of the metal substrate on the first or second side of the metal substrate to a depth to define an array of rectangular-shaped portions on the first or second side of the metal substrate.

4. The method of claim 3, wherein the attaching of the semiconductor dies comprises attaching the semiconductor dies to the rectangular-shaped portions of the metal substrate on the first side of the metal substrate.

5. The method of claim 3, wherein the attaching of the semiconductor dies comprises attaching the semiconductor dies to portions of the metal substrate corresponding to the rectangular-shaped portions on the second side of the metal substrate.

6. The method of claim 5, further comprising:
plating an intermediate product formed by the attaching of the redistribution layer.

7. The method of claim 6, further comprising:
marking product information on the metal substrate after the plating of the intermediate product.

8. The method of claim 1, wherein the grinding of the part of the metal substrate comprises grinding the metal substrate until the semiconductor dies are electrically separated.

9. The method of claim 1, wherein the metal substrate comprises a copper substrate.

10. The method of claim 1, wherein the preparing of the metal substrate comprises etching portions of the second side of the metal substrate to form recessed areas on the second side of the metal substrate,
wherein the forming of the mold member comprises forming the mold member in the recessed areas, and
wherein the grinding of the mold member formed on the second side of the metal substrate comprises grinding the mold member until a plurality of mold member portions spaced apart from each other are formed in the recessed areas.

11. A method to manufacture a semiconductor package, the method comprising:
attaching semiconductor dies to a first side of a metal substrate so that the semiconductor dies are spaced apart on the first side;
forming a mold member in areas between the attached semiconductor dies and on a second side of the metal substrate;
grinding the mold member formed on the second side of the metal substrate and a part of the metal substrate to reduce a thickness of the mold member and the metal substrate;
attaching a redistribution layer to the semiconductor dies; and
cutting in an area between adjacent semiconductor dies among the semiconductor dies to separate the adjacent semiconductor dies.

12. The method of claim 11, further comprising:
etching the first side of the metal substrate to form recessed areas in the first side of the metal substrate prior to the forming of the mold member,
wherein the forming of the mold member in the areas between the attached semiconductor dies and on the second side of the metal substrate comprises forming the mold member in the recessed areas.

13. The method of claim 12, wherein the grinding of the mold member on the second side of the metal substrate and the metal substrate comprises grinding the mold member on the second side of the metal substrate and the metal substrate so that the semiconductor dies are electrically separated from each other.

14. The method of claim 11, further comprising:
etching the second side of the metal substrate, which is disposed opposite to the first side, to form recessed areas in the second side prior to the forming of the mold member,
wherein the forming of the mold member in the areas between the attached semiconductor dies and on the second side of the metal substrate comprises forming the mold member in the recessed areas.

15. The method of claim 14, wherein the grinding of the mold member on the second side of the metal substrate and the metal substrate comprises grinding the mold member on the second side of the metal substrate and the metal substrate so that the semiconductor dies are electrically connected to each other by the metal substrate.

* * * * *